United States Patent
Babine et al.

(10) Patent No.: US 6,291,139 B1
(45) Date of Patent: Sep. 18, 2001

(54) PROCESS FOR FABRICATING THREE-DIMENSIONAL POLYMER LAYER STRUCTURES

(75) Inventors: Sergey Babine, Griesheim; Hans Wilfried Koops, Ober-Ramstadt, both of (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/029,505

(22) PCT Filed: Aug. 24, 1996

(86) PCT No.: PCT/DE96/01579

§ 371 Date: Jul. 9, 1998

§ 102(e) Date: Jul. 9, 1998

(87) PCT Pub. No.: WO97/07970

PCT Pub. Date: Mar. 6, 1997

(30) Foreign Application Priority Data

Aug. 30, 1995 (DE) .............................. 195 31 860
Jul. 20, 1996 (DE) .............................. 196 30 705

(51) Int. Cl.$^7$ ...................................... G03F 7/26

(52) U.S. Cl. .................. 430/322; 430/330; 250/492.3
(58) Field of Search .................. 430/311, 322, 430/330, 296, 323; 250/492.3

(56) References Cited

U.S. PATENT DOCUMENTS

| 4,430,153 | 2/1984 | Gleason et al. | 156/643 |
| 4,560,641 | * 12/1985 | Kokaku et al. | 430/312 |
| 4,578,587 | 3/1986 | Behringer et al. | 250/492.2 |
| 5,104,684 | 4/1992 | Tao et al. | 427/38 |
| 5,157,547 | 10/1992 | Paesold | 359/581 |

(List continued on next page.)

FOREIGN PATENT DOCUMENTS

| 37 05 361 | 8/1988 | (DE) . |
| 41 12 695 | 7/1992 | (DE) . |
| 41 09 972 | 8/1992 | (DE) . |

(List continued on next page.)

OTHER PUBLICATIONS

Joubert et al. "Plasma polymerized all–dry resist process for 0.25 γm photolithography", J. Vac. Technol. B 12(6) (1994), 3909–3913.

Guttmann et al. "Behavior of Amorphous $As_2S_3$ Layers After Photon, Electron and X–ray Exposures", SPIE 1361 (1990),999–1010.

Zengerle et al. "Fabrication of Optical Beamwidth Transformers for Guided Waves on InP Using Wedge–Shaped Tapers". J. Vac. Sci. Technol. B9 (6) (1991), p. 3459.

Unger et al. "High Resolution Electron Bean Lithography for Fabricating Visible Semiconductor Lasers with Curved Mirrors and Integrated Holograms", Microelectronic Engineering, 23 (1994), p. 461–464.

(List continued on next page.)

Primary Examiner—Kathleen Duda
(74) Attorney, Agent, or Firm—Kenyon & Kenyon

(57) ABSTRACT

A process for the fabrication of polymer layers structured in three dimensions, such as of lenses, which are applied to the end of optical fibers or of laser light sources. Dry resist that is polymerizable through exposure is used as a base substance. The dry resist is applied to a substrate and is exposed with a dose apportionment that is predefined as a function of space and time in a structure region. The structure region is precalculated with submicrometer precision using image-processing methods and exhibits the form of the desired lens. The lens-shaped structure region that is polymerized through exposure is removed from the unexposed dry resist. The process of the present invention makes it possible to place lenses on an optical fiber or a laser with submicrometer precision.

10 Claims, 1 Drawing Sheet

U.S. PATENT DOCUMENTS

| | | |
|---|---|---|
| 5,288,368 | 2/1994 | DeMarco et al. ..................... 156/643 |
| 5,298,112 | 3/1994 | Hayasaka et al. .................... 156/643 |
| 5,384,464 | 1/1995 | De Fornel et al. ............... 250/492.2 |
| 5,402,514 | 3/1995 | Booth et al. .......................... 385/130 |
| 5,454,919 | 10/1995 | Hill et al. ......................... 204/192.11 |
| 5,476,748 | 12/1995 | Steinmann et al. ................... 430/269 |
| 5,561,675 | 10/1996 | Bayon et al. ............................. 372/6 |
| 5,578,821 | 11/1996 | Meisberger et al. ................. 250/310 |
| 5,811,211 | 9/1998 | Tanaka et al. .......................... 430/30 |
| 5,849,639 | 12/1998 | Molley et al. ........................ 438/414 |
| 5,858,863 | 1/1999 | Yokoyama et al. .................. 438/514 |

FOREIGN PATENT DOCUMENTS

| | | |
|---|---|---|
| 42 02 651 | 8/1993 | (DE) . |
| 44 16 597 | 11/1995 | (DE) . |
| 44 24 236 | 1/1996 | (DE) . |
| 195 06 880 | 8/1996 | (DE) . |
| 196 28 353 | 3/1997 | (DE) . |
| 196 30 705 | 3/1997 | (DE) . |
| 195 45 721 | 6/1997 | (DE) . |
| 0 064 101 | 11/1982 | (EP) . |
| 0 226 893 | 7/1987 | (EP) . |
| 0 568 235 | 11/1993 | (EP) . |
| 0 571 727 | 12/1993 | (EP) . |
| 2 305 440 | 4/1997 | (GB) . |
| 5303008 | 11/1993 | (JP) . |
| 07209536 | 8/1995 | (JP) . |
| 1045312 | 9/1983 | (RU) . |
| WO 95/02472 | 1/1995 | (WO) . |
| WO 95/20831 | 8/1995 | (WO) . |
| WO 95/31020 | 11/1995 | (WO) . |

OTHER PUBLICATIONS

* Bellman et al. "Precision Glass Microlens Array by a Photo–Thermal Techique", SPIE O–E Lase 88, Jan. 14, 1988.

Presby et al. "Near 100% Efficient Fibre Microlenses" Electronic Letters, Mar. 12, 1992, vol. 28, No. 6, pp. 582–584.

Dändliker et al. "Photolithgraphy with Lenslet Arrays", IG–Fachbericht 132 Vacuum Electronics and Displays, 1995, pp. 241–246.

Stemmer et al. "Design and Fabrication of Synthetic Lenses in Silicon" SPIE, vol. 1732 Holographics International 92, 77–88.

Dix et al. "Electron–Beam Fabrication and Focused Ion–Beam Inspection of Submicrom Structured Diffreactive Opical Elements", J. Vac, Sci, Technol. B 12 (6) (1994) pp. 3708–3711.

Maker et al. "Phase holograms in polymethylmethacrylate", J. Vac. Sci. Technol. B 10(6) (1992) p. 2516–2519.

Koops et al. "High Resolution Electron Beam Induced Deposition" Proc. 31 Int. Symp. On Electron, Ion and Photon Beams, J. Vac. Sci. Technol. B6(1)(1988) P. 477–481.

Ochial et al. "Focused Ion Beam Technology", Solid State Technologies, Nov. 1987, pp. 75–79.

Matsui et al. "New Selective Deposition Technology by Electron Beam Induced Surface", J. Vac. Sci. Technol. B 4(1), Jan./Feb. 1986, pp. 299–304.

Paek et al. "Formation of a Spherical Lens at Optical Fiber Ends with A $CO_2$ Laser", Applied Optics Vol. 14, No. 2 Feb. 1975, pp. 294–298.

Glas et al. "A high power neodyminum–doped fiber laser using a novel fiber geometry", Optics Communications, 141 (1997), pp. 336–342.

Pendry, "Photonic band structures", Journal of Modern Optics, 1994, vol. 41, No. 2, pp. 209–229.

Smith et al., Defect studies in a two–dimensional periodic photonic lattice Journal of Modern Optics, 1994, vol. 41, No. 2, 395–404.

Koops et al. "Evaluation of the dry resist Vinyl–T8 and ist application to optical microlenses" Microelectronic Engineering 30 (1996), pp. 539–542.

Shigihara et al. "Achieving Broad–Area Laser Diodes with High Output Power and Single–Lobed Far–Field Patterns in the Lateral Direction by Loading a Modal Reflector", IEEE Journal of Quantum Electronics, vol. 30, No. 8 Aug. 1994, pp. 1683–1690.

Langheinrich et al. "Nanostructure fabrication using lithium fluoride films as an electron beam resist" J. Vac Sci. Technol. B 10(6) Nov./Dec. 1992, pp. 2868–2872.

Weber, "Der Prozess der Elektonenstrahlinduzierte Deposition"(Disseration—abstract attached) Only Abstract Considered.

Babin S.V. Et Al.: "Investigation of New Dry High Sensitive Resist Using 100 KV Electron Lithography", Microelectronic Engineering, vol. 23, No. 1/04, Jan. 1, 1994, pp. 303–304.

Korchkov, T.N. Et Al.: "All–Dry Vacuum Submicron Lithography", Thin Solid Films, vol. 101, 1983, pp. 369–372.

Stemmer, A. Et Al.: "Design and Fabrication of Multilevel Diffractive Optical Elements (DOEs) and Holographic Optical Elements (HOEs) Cited in the Application", Microelectronic Engineering , vol. 21, No. 1/4, 1993, Amsterdam, NL, pp. 471–474.

Babin, S. Et Al., "Dry Resist Technology to Fabricate Optimized Micro–Lenses Centered to the End of a Monomode Fiber With Electron Beam Lithography", SPIE–The International Society for Optical Engineering Proceedings, vol. 2863, Aug. 5, 1996, Denver Colorado, USA, pp. 95–101.

Babin, S. Et Al., "Three–Dimensional Electron Beam Lithography Using an All–Dry Resist Process", Journal of Vacuum Science and Technology, vol. 14, No. 6, Dec. 1996, pp. 3860–3863.

K. H. Brenner et al., "Deep Proton Irradiation of PMMA for a 3D Integration of Micro–Optical Compontents" Teubner–Texte zur Physik, 1993, pp. 159–176.

Wayne M. Moreau, "Developing Resist Images", Semiconductor Lithography, 1988, pp. 515–523.

T. Shiono et al., "Blazed reflection micro–Fresnel lenses fabricated by electron–beam writing and dry development", Optics Letters, vol. 15, No. 1, Jan. 1, 1990, pp. 84–86.

M. Frank et al., "Microlenses in polymethyl methacrylate with high relative aperture", Applied Optics, vol. 30, No. 19, Jul. 1, 1991, pp. 2666–2667.

Y. A. Carts, "Small gradient–index lenses are the tip of the iceberg of tiny optical elements (<2 mm in diameter) that can be mass–produced for a variety of applications", Laser Focus World, Jun. 1991, pp. 93–99.

B. Wagner et al., "Microfabrication of complex surface topographics using grey–tone lithography", Sensors and Actuators A 46–47 (1995) pp. 89–94.

"Dry Development Processing of Resists Via Surface Incorporation of Iron–Containing Complexes", IBM Techn. Discl. Bull. vol., 37, No. 04B, Apr. 1994, p. 123.

* cited by examiner

PROCESS FOR FABRICATING THREE-DIMENSIONAL POLYMER LAYER STRUCTURES

FIELD OF THE INVENTION

The present invention relates to fabrication of formed polymer layers, structured in three dimensions, and, in particular, to fabrication of optical lenses.

RELATED TECHNOLOGY

Lenses are used in integrated optics, in particular, for coupling optical lasers to optical fibers.

One known method for coupling lasers and fibers using lithographic processes discloses installing taper couplers along with a laser when it is assembled in an indium phosphide base material. See 1.) R. Zengerle, H. J. Brückner, H. W. P. Koops, H.-J. Olzhausen, G. Zesch, A. Kohl, A. Menschig, "Fabrication of Optical Beamwidth Transformers for Guided Waves on InP Using Wedge-Shaped Tapers", J. Vac. Sci. Technol. B 9 (6) (1991) 3459.

Curved interfaces, such as cylindrical lenses, which are directly contiguous to the laser and have a focusing effect in one sectional plane, may be defined by means of nanolithography using corpuscular beam lithography and dry-etched by means of reactive dry-etching in additional process steps. See 2.) Unger, V. Boegli, P. Buchmann, R. Germann, "High Resolution Electron Beam Lithography for Fabricating Visible Semiconductor Lasers with Curved Mirrors and Integrated Holograms", Microelectronic Eng. 23, (1994) 461. Glass spheres may be micromechanically adjusted and bonded to flash-etched glass fibers. The glass spheres may optically adapt in both directions, with rotational symmetry, the emission profile of the glass fibers. See 3.) R. H. Bellmann, N. F. Borelli, J. Dafin, L. G. Mann, B. H. Raeder, "Precision Glass Microlens Array by a Photo-Thermnal Technique", SPIE O-E Lase 88, (Jan.14, 1988).

By fusing the fibers and rounding them off in a thermal process, as well as by means of laser ablation or mechanical polishing, round end profiles can be produced on the fiber ends.

Glass members may be produced as separate structural components having suitable curvature at the ends. The glass members may be inserted as interposed lenses into the optical transmission channel to achieve the desired coupling objective. Adjustment to submicrometer precision can constitute a problem See 4.) SMILE lenses produced by CORNING, France.

5.) GRIN lenses produced by NIPPON SHEET GLASS, Japan, NSG-Selfog Product Guide, NSG America Inc., Somerset, N.J. 08873.

Known methods do not teach using three-dimensional patterned polymer layers as refractive lenses in integrated optics. See 6.) R. Dändliker, R. Völkel, H. P. Herzig, W. B. Hugle, "Photolithography with Lenslet Arrays", IG-Fachbericht 132 "Vacuum Electronics and Displays", (1995) 241;

7.) A. Stemmer, H. Zarschizky, F Mayerhofer, G. Lefranc, H. W. Schneider, P. Galloway, SPIE, vol. 1732, Holographics International, 92, 77;

8.) A. Stemmer, H. Zarschizky, E. Knapek, G. Lefranc, H. Scherer-Winner, "Design and Fabrication of Multilevel Diffractive Optical Elements (DOES) and Holographic Optical Elements (HOEs)", Microelectronic Engineering, vol. 21, no. 1–4, (1993) 471–474;

9.) C. Dix, P. F. McKee, A. R. Thurlow, J. R. Towers, D. C. Wood, N. J. Dawes, J. T. Whitney, "Electron-Beam Fabrication and Focused Ion-Beam Inspection of Submicron Structured Diffractive Optical Elements", J. Vac. Sci. Technol. B 12(6) (1994) 3708–37011; and 10.) P. D. Maker, R. E. Müller, "Phase holograms in polymethylmethacrylate", J. Vac. Sci. Technol. B 10(6) (1992) 2516.

Attempts have also been made in gas-discharging processes to produce electron-sensitive polymerizates, useful applications of which remains to be determined. See 11.) O. Joubert, T. Weidmami, A. Joshi, R. Cirelli, S. Stein, J. T. C. Lee, S. Vaidya, "Plasma Polymerized All-Dry Resist Process for 0.25 $\mu$m Photolithography", J. Vac. Technol. B 12(6) (1994) 3909.

At the Techno Center in Moscow, a substance has been synthesized as dry resist for corpuscular beam and optical lithography. This substance works with a sensitivity similar to that of the known electron resist PMMA (polymethacrylate). This resist, which has a resolution capability that is suitable for lithography, is vapor-deposited and dry-developed under a vacuum. Because there is no need for wet process steps, the resist is very environmentally clean. See 12.) S. V. Babin, A. 1. Holopkin, M. N. Lyakhov, K. A. Valiev, L. V. Velikov, E. N. Zhikharev, Microcircuit Engineering 23 (1994) 303; and 13.) V. P. Karchkov, T. N. Martynova, V. S. Damlovich, Thin Solid Films 4 (1983) 3696

When corpuscular beam-induced deposition is used, it is possible to locally convert monomers, adsorbed from the gas phase, into polymers. This process does not require any development when producing three-dimensional polymer structures. See 14.) H. W. P. Koops, R. Weiel, D. P. Kern, T. H. Baum, "High Resolution Electron Beam Induced Deposition", Proc. 31. Int. Symp. on Electron, Ion and Photon Beams, J. Vac. Sci. Technol. B 6 (1) (1988) 477.

SUMMARY OF THE INVENTION

The process of the present invention is based on using a polymerizable dry resist and on the selective exposure of dry resist areas, preferably with the inclusion of the corpuscular beam-induced deposition process.

Octavinylsilsesquioxane dry resist that is polymerizable using photon or corpuscular beams is particularly suitable for use as a dry resist.

In accordance with the present invention, the polymerizable dry resist is applied to the end surface of an optical structure and irradiated in one region which corresponds to the form of the desired optical lens. The region to be irradiated is preferably defined through the use of imnage-processing methods. In this way structure region precalculated for the lens is defined with submicrometer precision. This region undergoes a controlled irradiation process. The irradiation parameters necessary for the irradiation process, ie., those required to apportion the dosed radiation as a function of space and time, are determnined on the basis of the desired lens form. The irradiation process is then carried out automatically using computerized control processes.

The lens-shaped structure region polymerized by the irradiation is subsequently removed from the unexposed dry resist.

Methods for removing the polymerized structure region include the following:

1. The lens-shaped structure region polymerized through exposure is removed from the dry resist using physical development, such as heating under a high vacuum;
2. The lens-shaped structure region polymerized through exposure is removed from the dry resist using physical development, such as heating by air; and
3. The lens-shaped structure region polymerized through exposure is removed from the dry resist using dry-chemical development, such as processing in a gas discharge.

One embodiment of the present invention comprises applying, prior to exposure, the polymerizable dry resist used as starting substance to the three-dimensional, optical lens surface. This embodiment is especially advantageous when working with optical fibers or laser light sources whose optical output faces are to be adapted to curved ray paths.

The process of the present invention makes it possible to produce miniaturized, refractive lenses having a spherical or a non-spherical geometry. By selecting different profiles in various spatial directions, the beam characteristic of a given optional fiber or laser can be accurately corrected. The emissivity or acceptance characteristic can be adjusted to a rotationally symmetric profile or to a previously defined profile. In the same way, prisms and beam splitters can be directly produced. These components are removed from the resist using dry-chemical development, eg.; precipitation of organic compounds.

This technique can also be used to produce lens arrays on surfaces for use in the parallel, optical focusing of a plurality of pixels in an array pattern. Such focusing may be required for enhancing the sensitivity of optical detectors, flat TV cameras or diode arrays. The process is also suited for producing aspherical surfaces having complex sectional curves. The invention makes is possible to center the desired elements with submicrometer precision to the necessary application site.

An embodiment of the present invention is illustrated in FIG. 1. In this embodiment, a dry-resist technique is used to coat the small end surface of an optical fiber or a laser with a material from which an optically effective three-dimensional structure is fabricated, as indicated by the numeral 102 in FIG. 1. This makes it possible to pre-process a surface that otherwise would not be accessible, with a high level of precision. The desired end product may thus be fabricated at a precise location. Using a scanning electron microscope in a lithographic process, image-processing methods can be applied to place a pattern with submicrometer precision on the fibers or the laser. The pattern can be adapted to the existing three-dimensional surface of the fiber or of the laser. This patterning process is denoted by number 104 in FIG. 1. The dry resist is thermally developed following exposure, as indicated by the numeral 106 in FIG. 1. There is no need for wet-chemical solvents in the fabrication process. Consequently, the manufacturing process of the present invention is a highly precise dry process, which can be inexpensively automated.

BRIEF DESCRIPTION OF THE DRAWING

The present invention may be more easily understood with reference to the following figure.

DETAILED DESCRIPTION

Figure 1:
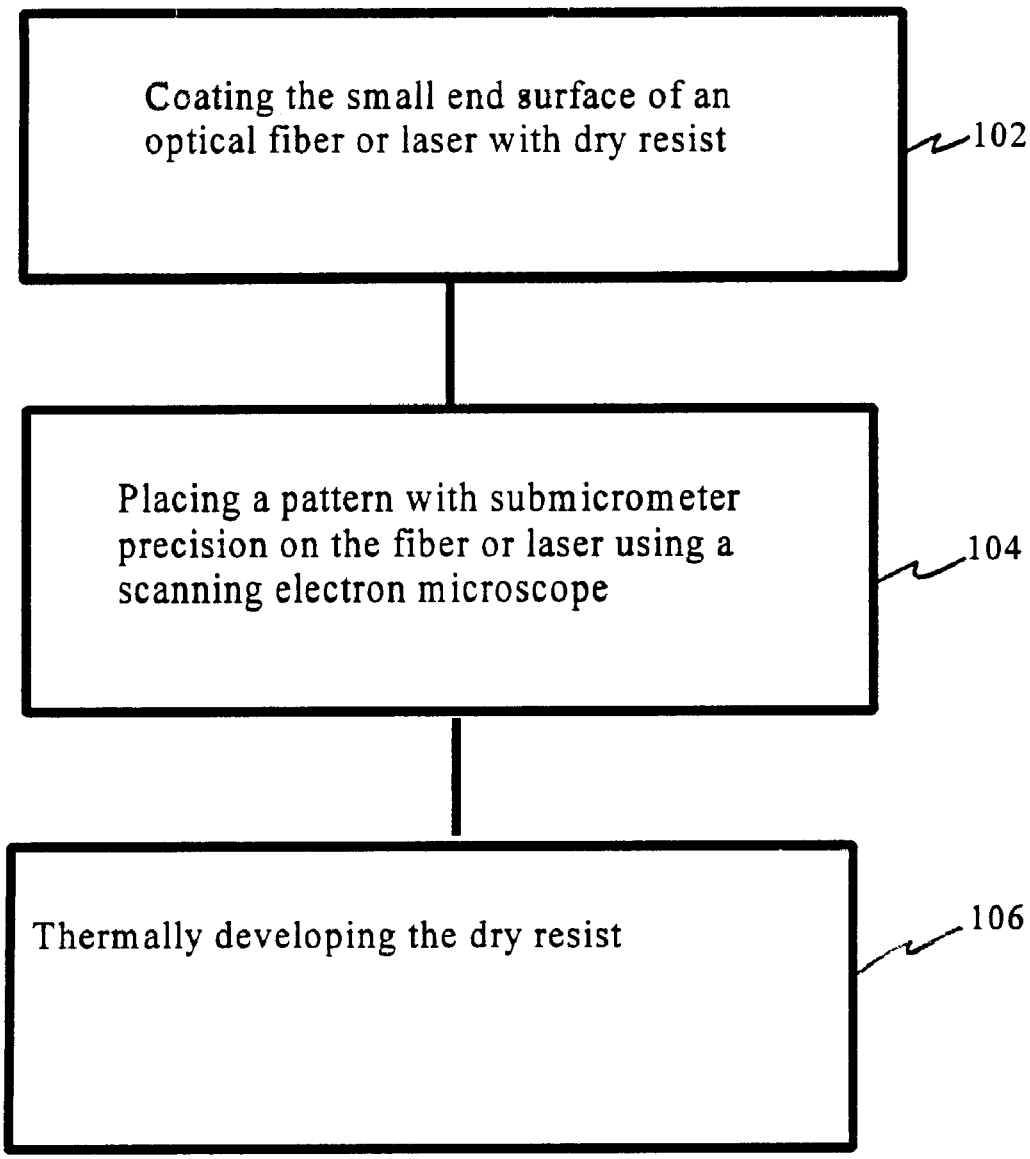
FIG. 1 is a block diagram of a method in accordance with a preferred embodiment of the present invention.

These advantages may also be realized in other embodiments of the present invention in which lenses are made from adsorbed molecules which polymerize in the corpuscular beam. During exposure, the adsorbed molecules settle out of the vapor phase onto the surface. With beam-induced deposition, no further development is required and the product is ready following the deposition process. Using this embodiment of the invention, through appropriate material selection, highly refractive materials or materials adapted to a refractive index can be applied as lenses or as anti-reflecting layer sequences.

The material selection process is carried out by varying the precursor molecular beam. This process can be automated and incorporated into the exposure-control process. In this way, desired refractive profiles and structures that otherwise would require many complex process steps may be produced.

What is claimed is:

1. A method for fabricating polymer layers using dry-resist technology, the polymer layers forming a three-dimensional structure for use in refractive integrated optics, the method comprising the steps of:

applying to a substrate a dry resist that is polymerizable through exposure;

exposing the dry resist with a dose apportionment of radiation, the dose apportionment being predefined as a function of a space and time to polymerize a structure region, the structure region being precalculated with submicrometer precision using image-processing methods and corresponding to a desired refractive optical structure suitable for use in integrated fiber and/or solid state laser optics; and separating using a dry process the polymerized structure region from unexposed dry resist.

2. The method as recited in claim 1 wherein the dry resist contains octavinylsilsesquioxane, the dry resist being polymerizable through photon or corpuscular beams.

3. The method as recited in claim 1 wherein the structure region polymerized through exposure is separated from the dry resist by a physical development process.

4. The method as recited in claim 3 wherein the physical development process includes heating under a vacuum.

5. The method as recited in claim 3 wherein the physical development process includes heating by air.

6. The method as recited in claim 1 wherein the structure region polymerized through exposure is separated from the dry resist by a dry-chemical development process.

7. The method as recited in claim 6 wherein the dry-chemical development process includes processing in a gas discharge.

8. The method as recited in claim 1 wherein the substrate is an end surface of an optical structure.

9. The method as recited in claim 1 wherein the steps of applying and exposing include the steps of providing molecules in vapor phase above the substrate, polymerizing the molecules passing through a corpuscular beam, and precipitating polymerized molecules onto the substrate.

10. The method as recited in claim 9 wherein the substrate is an optical structure.

* * * * *